United States Patent [19]

Bauer

[11] Patent Number: 5,700,359

[45] Date of Patent: Dec. 23, 1997

[54] METHOD OF POLARIZING AT LEAST ONE LARGE AREA SHEET OF FERROELECTRIC MATERIAL

[75] Inventor: François Bauer, Saint-Louis, France

[73] Assignee: Institut Franco Allemand de Recherches de Saint-Louis, Saint-Louis Cedex, France

[21] Appl. No.: 604,027

[22] Filed: Feb. 20, 1996

[30] Foreign Application Priority Data

Feb. 17, 1995 [FR] France ................................. 95 01868

[51] Int. Cl.$^6$ ............................................. H04R 17/00
[52] U.S. Cl. .................... 204/164; 204/165; 29/25.35; 427/100; 427/466
[58] Field of Search ............................ 204/164, 165; 29/25.35; 427/100, 466

[56] References Cited

U.S. PATENT DOCUMENTS 4,611,260  9/1986  Bauer .......................... 29/25.35

FOREIGN PATENT DOCUMENTS

| 2 538 157 | 6/1984 | France . |
| 2 700 200 | 7/1994 | France . |
| 1 442 277 | 7/1976 | United Kingdom . |
| 2 098 802 | 11/1982 | United Kingdom . |

*Primary Examiner*—Kathryn L. Gorgos
*Assistant Examiner*—Kishor Mayekar
*Attorney, Agent, or Firm*—Young & Thompson

[57] ABSTRACT

A method of polarizing at least one large area sheet of ferroelectric material (1). The method comprises the following successive steps: placing films of ferroelectric material (2, 3) of thickness $e_1$ against two opposite faces (1a, 1b) of the sheet (1) of thickness $e_2$, the thickness $e_1$ being a function of the respective coercive fields of the materials constituting the sheet (1) and the films (2, 3); placing electrodes (4, 5) on either side of and against the films of ferroelectric material (2, 3); compressing the resulting complex; and applying a cyclical voltage between the two electrodes (4, 5).

14 Claims, 1 Drawing Sheet

5,700,359

METHOD OF POLARIZING AT LEAST ONE LARGE AREA SHEET OF FERROELECTRIC MATERIAL

BACKGROUND OF THE INVENTION

1. Field of the Invention

The present invention relates to a method of polarizing one or more sheets of ferroelectric material of large area.

2. Description of the Prior Art

Document FR-A-2 538 157, filed by the present Applicant, discloses a method and apparatus for polarizing ferroelectric materials. In that method, a low frequency alternating electric field is applied to the ferroelectric materials, and the amplitude of the alternating electric field is progressively increased so as to leave controlled remanent polarization in the material. The maximum amplitude of the electric field is relatively large since it must be greater than the coercive field of the ferroelectric material.

That method is now widely applied, in particular for making piezoelectric or pyroelectric sensors. In general, the procedure begins by depositing the measurement electrodes of the sensor on two opposite surfaces of a sheet of ferroelectric material, e.g. by cathode sputtering or by evaporation, and then the measurement electrodes are used to apply an alternating electric field during the polarization stage. The sheet of ferroelectric material is generally compressed to limit variations in volume which may be local and due to high values of electric field during the polarizing stage, with such variations in volume being of a kind that can affect the reproducibility of sensor characteristics. In practice, the pressures that can be exerted in this way on the sheet of ferroelectric material are limited, typically to a few hundreds of bars. If such values are exceeded, then the ferroelectric material is damaged close to the edges of the deposited electrodes, or the electrodes themselves are damaged if they are of relatively large area.

In addition, the respective portions of the two measurement electrodes which extend away from the polarized zone for connection purposes must be spaced apart from each other parallel to the sheet of ferroelectric material. Such spacing is necessary because of the high voltages used: there is a risk of dielectric breakdown, electrical flash-over, and polarization of the material if the spacing is small. That results in an increase in the size of the sensor.

The above-described method is difficult to apply to a polarizer occupying a zone of small size on a sheet of ferroelectric material, typically a zone having a size of less than 1 mm$^2$ on a sheet that is about 25 µm thick. For such small dimensions, edge effects become significant or even preponderant, and they complicate the interpretation of current measurements. Such edge effects also have an effect on the uniformity of the induced remanent polarization. In addition, for such small dimensions, local stresses in the ferroelectric material are large and require high pressure in order to limit the effect thereof, thereby giving rise to the mechanical strength problems mentioned above.

To overcome the drawbacks of the above-described method, document FR-A-2 700 220, also filed by the present Applicant, proposes a method of polarizing a zone of a sheet of ferroelectric material in which electrodes are deposited on two opposite surfaces of the sheet in such a manner that the zone to be polarized extends in the gap between the two electrodes, the zone to be polarized is compressed, and a varying voltage is applied between the electrodes, and in which each of the electrodes is associated with a respective insulating support of area greater than that of the zone to be polarized on the sheet of ferroelectric material, the insulating support including on opposite sides of the electrode, a layer of dielectric material of thickness that is at least twice the thickness of the sheet of material to be polarized and whose outside surface is flush with the outside surface of the electrode and whose permittivity is close to that of the sheet to be polarized.

That method seeks essentially to polarize zones of small size and it is difficult to apply it to polarizing a sheet of ferroelectric material of large area. In addition to the above-mentioned drawbacks of the method described in document FR-A-2 538 157 (edge effects, uniformity of the induced remanent polarization, ...) sheets of large area also give rise to drawbacks concerning the appearance of dielectric punctures of the sheet due to dust, due to mechanical defects, due to the sheet creasing under the applied field, etc.

SUMMARY OF THE INVENTION

A main object of the present invention is to mitigate or to remedy the limits of polarization methods known in the state of the art and to propose a polarization method that makes it possible to reach high levels of polarization and that is particularly suitable for polarizing sheets of ferroelectric material of large area.

To this end, the invention provides a method of polarizing at least one large area sheet of ferroelectric material, the method being comprising the following successive steps: placing films of ferroelectric material of thickness $e_1$ against two opposite faces of the sheet of thickness $e_2$, the thicknesses $e_1$ and $e_2$ being a function of the respective coercive fields of the materials constituting the sheet and the films; placing electrodes on either side of and against the films of ferroelectric material; compressing the resulting complex; and applying a cyclical electric voltage between the two electrodes.

It is thus possible to polarize at least one sheet of A4 type ferroelectric material by placing the sheet between two films of thicker ferroelectric material and by combining the permittivity variations of the various substances under the action of an electric voltage.

Because of the presence of the films of ferroelectric material, conduction is blocked, thereby making it possible for there to be an absence of real charge and thus making it impossible for an avalanche to occur under an electric field.

Use is made of the variation in the dielectric permittivity $\epsilon_1$ of films of ferroelectric material which increases strongly when the ferroelectric material polarizes on passing through the coercive field. Since electric induction is conserved, the electric field decreases in the films of ferroelectric material and, as a result, the electric field increases in the sheet of ferroelectric material (for continuing constant dielectric permittivity $\epsilon_2$ of the sheet of ferroelectric material) for the same applied voltage, which enables the ferroelectric material of the sheet to become polarized. According to an essential characteristic of the invention, the voltage applied between the two electrodes is cyclical since a direct voltage would not enable such a phenomenon to be produced. By applying a cyclical voltage, the following apply:

$$\epsilon_1 E_1 = \epsilon_2 E_2 = \text{induction}$$
$$V(\text{voltage}) = e_1 E_1 + e_2 E_2 + e_1 E_1 \text{ or}$$

-continued $$V = \left(2e_1\frac{\epsilon_2}{\epsilon_1} + e_2\right) E_2, \text{ where } E_2 = \frac{\epsilon_1}{\epsilon_2} E_1$$

in which equations:

$\epsilon_1$, $\epsilon_2$=dielectric permittivity $E_1$, $E_2$=electric field $e_1$=film thickness $e_2$=sheet thickness.

For constant V, if $\epsilon_1$ increases, then $$2e_1\frac{\epsilon_2}{\epsilon_1}$$

decreases, and with constant $e_1$, $E_2$ increases.

The method can be monitored by measuring total polarization, thus enabling the desired levels of piezoelectric activity or of pyroelectric activity to be achieved.

BRIEF DESCRIPTION OF THE DRAWINGS

Other characteristics and advantages of the present invention appear clearly on reading the following description given with reference to the accompanying drawings, in which.

DESCRIPTION OF THE PREFERRED EMBODIMENTS

Figure 1:
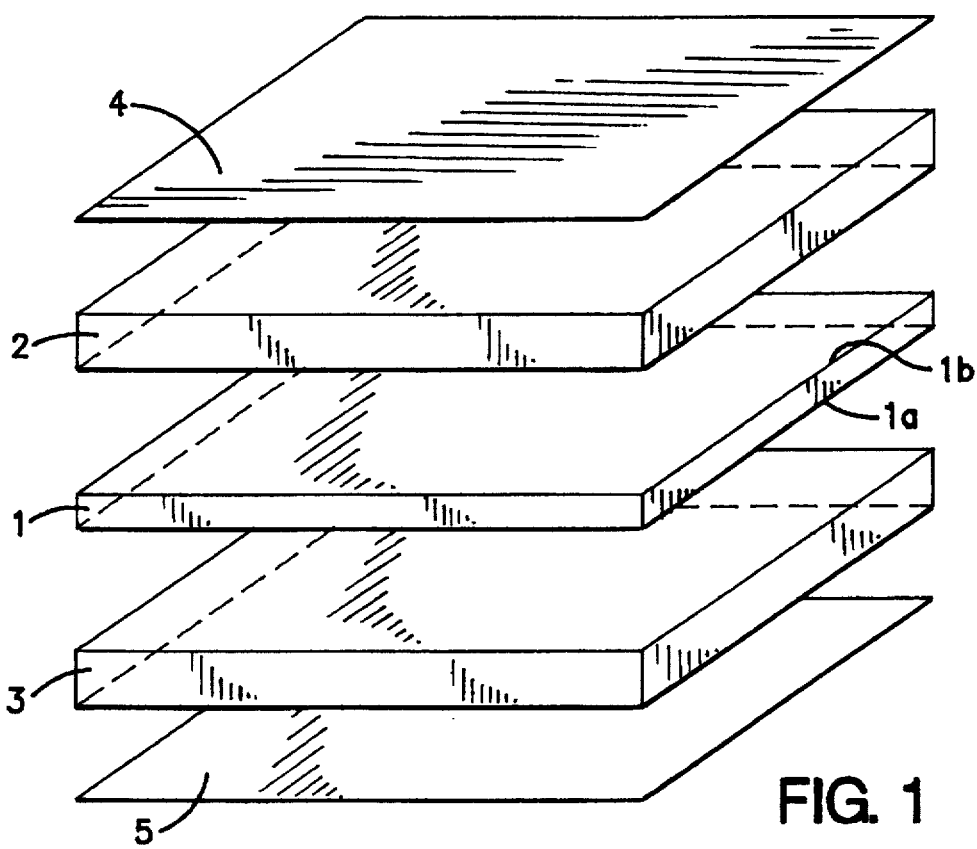
FIG. 1 is a diagrammatic exploded perspective view of a first embodiment of the invention showing a sheet of material to be polarized, two films of ferroelectric material, and two electrodes.
Figure 2:
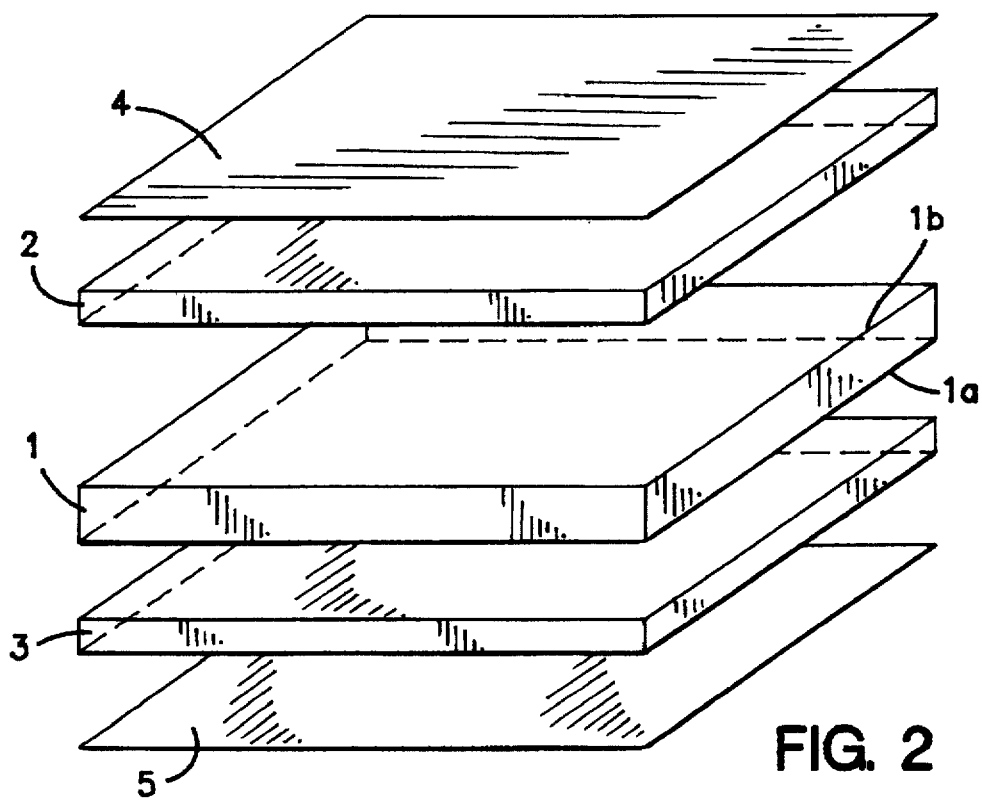
FIG. 2 is a diagrammatic exploded perspective view of a second embodiment of the invention showing a sheet of material to be polarized, two films of ferroelectric material, and two electrodes.

The complex of the invention comprising a sheet of ferroelectric material 1 that is to be polarized, two films of ferroelectric material 2 and 3, and two electrodes 4 and 5 is thus organized as illustrated in FIG. 1. To polarize the large area sheet of ferroelectric material 1, two films of ferroelectric material 2 and 3 of thickness $e_1$ are placed against the two opposite surfaces 1a and 1b of the sheet 1 which is itself of thickness $e_2$. The thickness $e_1$ of the films of ferroelectric material 2 and 3 must be equal to or greater than the thickness $e_2$ of the sheet of ferroelectric material 1 when the coercive field of the ferroelectric material of the films 2 and 3 is less than the coercive field of the ferroelectric material of the sheet 1 (FIG. 1) and vice versa, i.e. the thickness $e_1$ of the films of ferroelectric material 2 and 3 must be equal to or less than the thickness $e_2$ of the sheet of ferroelectric material 1 when the coercive field of the ferroelectric material of the films 2 and 3 is greater than the coercive field of the ferroelectric material of the sheet 1 (FIG. 2).

The area of the films of ferroelectric material 2 and 3 is at least equal to that of the sheet of ferroelectric material 1. The zone of the sheet 1 that is to be polarized is therefore at least identical to the area of the films of ferroelectric material 2 and 3.

Once the films of ferroelectric material 2 and 3 have been put into place, electrodes 4 and 5 are placed on opposite sides of and against these films of ferroelectric material 2 and 3.

The area of the electrodes 4 and 5 is at least equal to that of the sheet of ferroelectric material 1 so that by exerting pressure on the electrodes 4 and 5, it is possible to compress in uniform manner the sheet 1 that is to be polarized. Advantageously, the pressure applied in this way is large, and in particular it may reach $10^8$ Pa or 1 kbar or more depending on the materials in question.

Once the sheet 1 has been compressed, a cyclical voltage of the type described in document FR-A-2 538 157 is applied.

When polarized in this way, the sheet of ferroelectric material 1 exhibits a very large electret effect because of the absence of true charge. Di-polar compensation takes place gradually by means of ions and electrons in the air when the sample is put into contact with the atmosphere.

According to the invention, the sheet of ferroelectric material 1 and the films of ferroelectric material 2 and 3 can be made from items that are identical or different. Thus, the sheet 1 and the films 2 and 3 may all be based on PVDF. Or the films 2 and 3 may be based on VF2/VF3 (vinylidene difluoride/Trifluoroethylene) while the sheet 1 to be polarized is based on PVDF. Similarly, the sheet 1 and the films of ferroelectric material 2 and 3 may be single- or double-stretched.

In a preferred embodiment of the present invention, the ferroelectric material of the films 2 and 3 is a copolymer and the ferroelectric material of the sheet 1 is a polymer, a copolymer, or a composite copolymer, and is in particular filled with a magnetostrictive oxide or coated with a protective polymer.

The sheet of ferroelectric material 1 is not coated in a liquid dielectric insulator.

The above-described method can also be implemented with films 2 and 3 that are already polarized.

When the ferroelectric materials of the films 2 and 3 are polarized by the method of the invention, they can still be reused. By repeating the operation, the application of pressure creates a piezoelectric field which will be added to the applied field if it has the same sign. Applying a voltage in the indicated direction will then favor rapid polarization of the material 1 whose activity can be high.

The invention is described below by means of examples that are given by way of non-limiting indication.

EXAMPLE I

The following complex was prepared:

(1) copolymer: thickness: 50 µm coercive field $E_c$=44 MV/m (2) PVDF: thickness: 25 µm $E_c$=72 MV/m to 88 MV/m (1) copolymer: thickness: 50 µm $E_c$=44 MV/m Under application of the voltage of the type described in document FR-A-2 538 157, piezoelectric coefficients of 24 pC/N were obtained for 25 µm thick PVDF.

The applied voltage was 17 kV at the end of the method. To obtain the same piezoelectric coefficient it is necessary to apply 12 kV on 25 µm thick PVDF placed between electrodes.

EXAMPLE II

The following complex was prepared:

(1) copolymer: thickness: 50 µm $E_c$=44 MV/m (2) PVDF: thickness: 25 µm $E_c$=72 MV/m to 88 MV/m (1) copolymer: thickness: 50 µm $E_c$=44 MV/m For an end-of-cycle voltage of 12 kV to 14 kV, the following were obtained: overall polarization 6 to 7 µC/cm², and a piezoelectric coefficient of about 20 to to 21 µC/N for the PVDF.

EXAMPLE III

The following complex was prepared:

(1) copolymer: thickness: 110 µm $E_c$=40.9 MV/m (2) PVDF: thickness: 25 µm $E_c$=80 MV/m (1) copolymer: thickness: 110 µm $E_c$=40.9 MV/m By applying a cyclical voltage as follows: three cycles at 14 kV, three cycles at 15 kV, three cycles at 16 kV, and three cycles at 17 kV, the following were obtained: overall polarization of 6.5 to 7.5 µC/cm², and a piezoelectric coefficient of 22 pC/N for the PVDF.

EXAMPLE IV

The following complex was prepared:

(1) double-stretched PVDF: thickness: 50 µm $E_c$=72 MV/m to 88 MV/m (2) single-stretched PVDF: thickness: 25 µm $E_c$=88 MV/m (1) double-stretched PVDF: thickness: 25 µm $E_c$=72 MV/m to 88 MV/m By applying the following cyclical voltage: three cycles at 14 kV, three cycles at 15.5 kV, three cycles at 17 kV, and three cycles at 19 kV, a piezoelectric coefficient of 21 pC/N was obtained for the single-stretched PVDF.

EXAMPLE V

The following complex was prepared:

(1) copolymer: thickness: 50 µm $E_c$=44 MV/m (2) PVDF: thickness: 9 µm +PVDC: thickness: 1 µm (1) copolymer: thickness: 50 µm $E_c$=44 MV/m At 15 kV a piezoelectric coefficient of 15 pC/N was obtained for the PVDF+PVDC.

EXAMPLE VI

The following complex was prepared:

(1) PVDF: thickness: 9 mm (2) copolymer: thickness: 25 mm (3) PVDF: thickness: 9 mm At 8 kV, a piezoelectric coefficient of 26 pC/N was obtained for the copolymer.

In all the above examples, the copolymers were vinylidene fluoride—trifluoroethylene based copolymers (P(VDF-TrFE)) or $VF_2/VF_3$ or else vinylidene fluoride—tetrafluoroethylene type copolymers (P(VDF-TFE)).

I claim:

1. A method of polarizing at least one sheet of ferroelectric material having an area, the method comprising the following successive steps:

placing a film of ferroelectric material of film thickness $e_1$ against each of opposite faces of the sheet of sheet thickness $e_2$, the film thickness $e_1$ being a function of the sheet thickness $e_2$ and of a coercive field of each material of the sheet and of the films, the sheet of ferroelectric material and the films of ferroelectric material being made of different substances;

placing an electrode against a side of each film of ferroelectric material remote from said sheet to form an assemembly;

compressing the assembly; and applying a cyclical electric voltage between the two electrodes to polarize said sheet of ferroelectric material.

2. A method according to claim 1, wherein said films are made of a ferroelectric material whose coercive field is less than the coercive field of the ferroelectric material of the sheet, and the film thickness $e_1$ is at least equal to the sheet thickness $e_2$.

3. A method according to claim 1, wherein said films are made of a ferroelectric material whose coercive field is greater than the coercive field of the ferroelectric-material of the sheet, and the film thickness $e_1$ is at most equal to the sheet thickness $e_2$.

4. A method according to claim 1, wherein each of the films of ferroelectric material has an area which is at least equal to the area of the sheet of ferroelectric material.

5. A method according to claim 1, wherein each of the electrodes has an area which is less than the area of the sheet of ferroelectric material.

6. A method according to claim 1, wherein the films of ferroelectric material are films that are already polarized.

7. A method according to claim 1, wherein the sheet, the films of ferroelectric material, or both are single or double-stretched.

8. A method according to claim 1, wherein the ferroelectric material of the films is a copolymer.

9. A method according to claim 1, wherein the ferroelectric material of the sheet is a polymer.

10. A method according to claim 1, wherein the ferroelectric material of the sheet is a copolymer.

11. A method according to claim 1, wherein the ferroelectric material of the sheet is a composite polymer filled with magnetostrictive oxides, or a copolymer coated in a protective polymer.

12. A method according to claim 1, wherein the sheet of ferroelectric material is not coated in a liquid dielectric insulator.

13. A method according to claim 1, wherein the assembly is compressed as a function of a desired level of polarization.

14. A method according to claim 1, wherein the films of ferroelectric material are already polarized, and the electric voltage between the electrodes is applied in a direction indicated by a piezoelectric field created by compression of the assembly.

* * * * *